(12) United States Patent
Goossens et al.

(10) Patent No.: US 8,546,712 B2
(45) Date of Patent: Oct. 1, 2013

(54) MEMS DEVICES

(75) Inventors: Martijn Goossens, Veldhoven (NL);
Hilco Suy, Hulst (NL); Peter Gerard Steeneken, Valkenswaard (NL); Jozef Thomas Martinus van Beek, Rosmalen (NL)

(73) Assignee: NXP B.V., Eindhoven (NL)

( * ) Notice: Subject to any disclaimer, the term of this patent is extended or adjusted under 35 U.S.C. 154(b) by 129 days.

(21) Appl. No.: 13/203,624

(22) PCT Filed: Mar. 4, 2010

(86) PCT No.: PCT/IB2010/050939
§ 371 (c)(1),
(2), (4) Date: Oct. 21, 2011

(87) PCT Pub. No.: WO2010/100622
PCT Pub. Date: Sep. 10, 2010

(65) Prior Publication Data
US 2012/0043188 A1    Feb. 23, 2012

(30) Foreign Application Priority Data

Mar. 4, 2009 (EP) .................................... 09100162

(51) Int. Cl.
*H01H 57/00* (2006.01)
(52) U.S. Cl.
USPC ....................................................... 200/181
(58) Field of Classification Search
USPC ............. 200/181, 11 G, 11 H, 282, 283, 335, 200/559; 29/622
See application file for complete search history.

(56) References Cited

U.S. PATENT DOCUMENTS

| | | | |
|---|---|---|---|
| 4,959,515 A | 9/1990 | Zavracky et al. | |
| 5,635,750 A | 6/1997 | Schlaak et al. | |
| 8,115,576 B2 * | 2/2012 | Lu et al. ......................... | 335/78 |
| 2004/0180465 A1 | 9/2004 | Musolf et al. | |
| 2005/0012577 A1 | 1/2005 | Pillans et al. | |
| 2006/0125031 A1 | 6/2006 | Chou | |
| 2006/0220767 A1 | 10/2006 | Bozler et al. | |
| 2007/0087513 A1 | 4/2007 | Bouche et al. | |
| 2008/0035458 A1 * | 2/2008 | Watanabe et al. ............. | 200/181 |
| 2011/0140546 A1 * | 6/2011 | Gowda et al. ................. | 307/139 |
| 2011/0315526 A1 * | 12/2011 | Jahnes et al. .................. | 200/181 |

FOREIGN PATENT DOCUMENTS

| | | |
|---|---|---|
| EP | 1 760 736 A1 | 3/2007 |
| JP | 2000-173375 A | 6/2000 |
| WO | 01/61848 A1 | 8/2001 |
| WO | 03/078299 A1 | 9/2003 |
| WO | 03/096368 A1 | 11/2003 |
| WO | 2008/152559 A2 | 12/2008 |

OTHER PUBLICATIONS

International Search Report & Written Opinion for Int'l Patent Application No. PCT/IB2010/050939 (Aug. 25, 2010).

* cited by examiner

*Primary Examiner* — Edwin A. Leon

(57) ABSTRACT

A MEMS device comprises first and second opposing electrode arrangements (22,28), wherein the second electrode arrangement (28) is electrically movable to vary the electrode spacing between facing sides of the first and second electrode arrangements. At least one of the facing sides has a non-flat surface with at least one peak and at least one trough. The height of the peak and depth of the trough is between 0.01t and 0.1t where t is the thickness of the movable electrode.

14 Claims, 5 Drawing Sheets

MEMS DEVICES

This invention relates to MEMS (micro electromechanical system) devices.

MEMS technology is being used increasingly in electronic devices. Switches and tunable capacitors are examples of circuit components that can be made using MEMs technology.

MEMS switches can be used in a wide variety of applications, where high speed, typically low current, switching is required within a circuit. A MEMS switch has the advantage of a large capacitance switching range.

MEMS capacitors can also be used in a variety of circuits, such as tunable filters, tunable phase shifters and tunable antennas. One application of growing interest is in RF and microwave communications systems, for example for use in low cost reconfigurable/tunable antennas.

By way of example, FIG. 1 shows a MEMS capacitor with an electrically tunable dielectric and MEMS controlled dielectric spacing. The dielectric spacing is controlled in the manner of a switch, but the analogue electrical control of the dielectric properties can enable continuous tunability of the capacitor.

A tunable dielectric, ferroelectric or piezoelectric material can be used, such as $Ba_{1-x}Sr_xTiO_3$ or PZT as a dielectric layer 14. By combining a MEMS capacitor with a tunable dielectric, the advantages of the large capacitance switching range of RF MEMS switches are added to the advantages of the continuous tuning capability of tunable dielectrics. Moreover, use is made of the beneficial high dielectric constant of ferroelectrics, which can be 10-200 times higher than that of conventional dielectrics like Silicon Nitride. This dramatically reduces device size and increases continuous tuning range.

The device comprises opposite capacitor plates 10 (e1) and 12 (e2). Capacitor plate 12 is suspended by a spring configuration with stiffness k. The gap g is controlled by applying a voltage between plates 10 and 12. A dc voltage Vdc_switch is used to provide this MEMS switching function, from a dc voltage source 18. An rf ac voltage source 16 represents the rf signal that is flowing through the MEMS device during operation. The tunable dielectric has a tunable dielectric value $\in_d$, whereas the remaining dielectric spacing is air or vacuum, with dielectric value $\in_0$. The tunable dielectric is controlled by the voltage Vdc_tune, so that the single voltage applied to the electrode 12 controls the MEMS switching and dielectric tuning. The capacitor C and resistor R are optional decoupling components.

Of course, if a non-tunable dielectric is used, the MEMS device can be used simply as a capacitive switch (low frequency or rf frequency). Alternatively, if no dielectric is provided, the device can be used as a galvanic switch.

This invention relates specifically to problems associated with the switching process. In particular, a well-known limitation of capacitive MEMS switches is the relatively long time it takes for the top electrode to return from its lower position (switch is closed, capacitance is high) back to its upper position (switch is open, capacitance is low).

A second issue can arise when the switch closes. The upper electrode accelerates and then lands on the dielectric layer. During the landing, the electrode decelerates quickly, and the kinetic energy stored in the electrode is dissipated. This can cause deformation of the suspension springs when elevated voltages are used for the switching.

In some cases, a further problem can be relevant, that the voltage $V_{release}$ at which the switch releases is often low, which can result in a failure to open the switch when RF power is across the switch. When an RF voltage $V_{RF,rms}$ is across the switch, with $V_{RF,rms} > V_{release}$, the switch will not open even if the actuation voltage is removed.

According to the invention, there is provided a MEMS device comprising:
first and second opposing electrode arrangements, wherein the second electrode arrangement is electrically movable to vary the electrode spacing between facing sides of the first and second electrode arrangements,
wherein at least one of the facing sides has a non-flat surface with at least one peak and at least one trough,
wherein the second electrode arrangement has a thickness t in the range 1 to 10 μm,
and wherein the height of the peak and depth of the trough is between 0.01t and 0.1t.

This arrangement provides undulations in (at least) one of the surfaces of the electrode arrangements. The undulations function to store elastic energy, because they result in deformation of the movable electrode arrangement when it makes contact with the fixed electrode arrangement.

The undulations are sufficiently small compared to the thickness of the movable electrode arrangement that shear stresses in the movable electrode arrangement are not excessive. However, the undulations enable a progressive and gradual deceleration of the movable electrode. This can prevent unwanted spring oscillations.

The distance between a peak and adjacent trough is preferably in the range 40 to 300 μm (more preferably in the range 50 to 250 μm). This ensures the bending stress is limited, in particular below the yield stress (which will be different for different materials).

The non-flat surface can comprise at least two peaks and two troughs arranged periodically. This defines a repeating undulating surface.

The non-flat surface does not have to be the movable electrode. For example:
the moveable second electrode arrangement can have the non-flat surface and the first electrode arrangement has a flat surface; or
the moveable second electrode arrangement can have a flat surface and the first electrode arrangement has the non-flat surface (a dielectric layer of the first electrode arrangement can have the non-flat surface); or
the moveable second electrode arrangement and the first electrode arrangement can both have non-flat surfaces, with the peak of one aligned with the trough of the other.

The non-flat surface can have a shape such that the second derivate of the height along a flat axis of the surface is of constant magnitude. This provides an even distribution of mechanical (elastic) energy in the non-flat surface.

The device preferably comprises a MEMS capacitive switch, wherein one of the first and second electrode arrangements comprises a dielectric layer and a contact electrode, and the other of the first and second electrode arrangements comprises a contact electrode.

The invention also provides a method of manufacturing a MEMS device, comprising:
forming a static first electrode arrangement; and
forming a second opposing electrode arrangement with a thickness t in the range 1 to 10 μm, and supported to be electrically movable to vary an electrode spacing between facing sides of the first and second electrode arrangements,
wherein at least one of the facing sides is formed with a non-flat surface with at least one peak and at least one trough, with the height of the peak and depth of the trough between 0.01t and 0.1t.

One example of method comprises:
forming the first electrode arrangement on a substrate;
forming a sacrificial layer over the first electrode arrangement, the top surface of the sacrificial layer having a non-flat profile;
forming the second electrode arrangement over the sacrificial layer; and
removing the sacrificial layer, thereby exposing the underside of the second electrode arrangement with the non-flat surface.

This method enables the non-flat surface to be formed at the surface of the sacrificial layer, and this requires little additional processing compared to a standard approach. Forming the first electrode arrangement can comprise forming a contact electrode and a dielectric layer over the contact electrode.

The sacrificial layer can be formed with a first non-flat first sacrificial layer portion and a second uniform thickness second sacrificial layer portion. This is used to define the desired non-flat profile accurately, and with only one additional patterning step (of the first portion).

Examples of the invention will now be described in detail with reference to the accompanying drawings, in which.

The same reference numbers are used in different figures to denote the same components.

The invention provides a MEMS device in which at least one of the facing sides of the electrode arrangement has a non-flat surface with at least one peak and at least one trough. The height of the peak and depth of the trough is between 0.01t and 0.1t where t is the thickness of the movable electrode membrane. This undulation means that the movable electrode is decelerated gradually as the switch closes.

Figure 2:
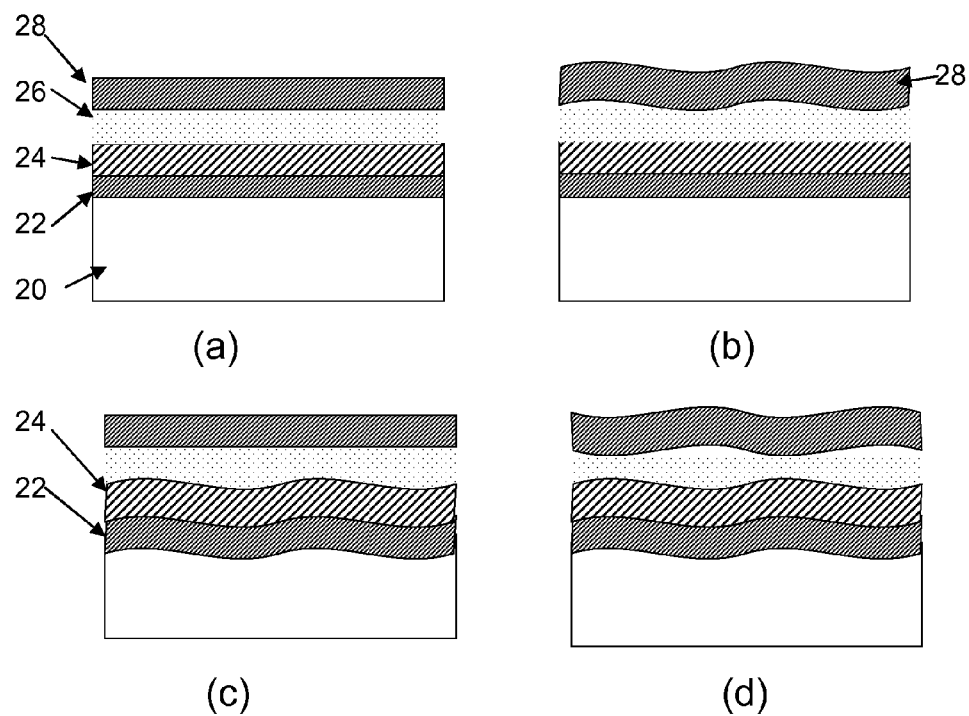
FIG. 2 shows in schematic form the conventional electrode arrangement as well as different examples of electrode arrangement in accordance with the invention.
Figure 2:
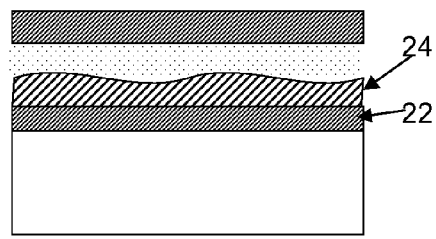

FIG. 2 shows various possible arrangements. FIG. 2(a) shows the known configuration, of substrate 20, static lower electrode 22, dielectric layer 24, air gap 26 and movable top electrode 28.

In accordance with the invention, at least one of the two electrode arrangements (which is intended to include any dielectric layer in contact with the electrode) is not flat, i.e. undulating.

Figure 1:
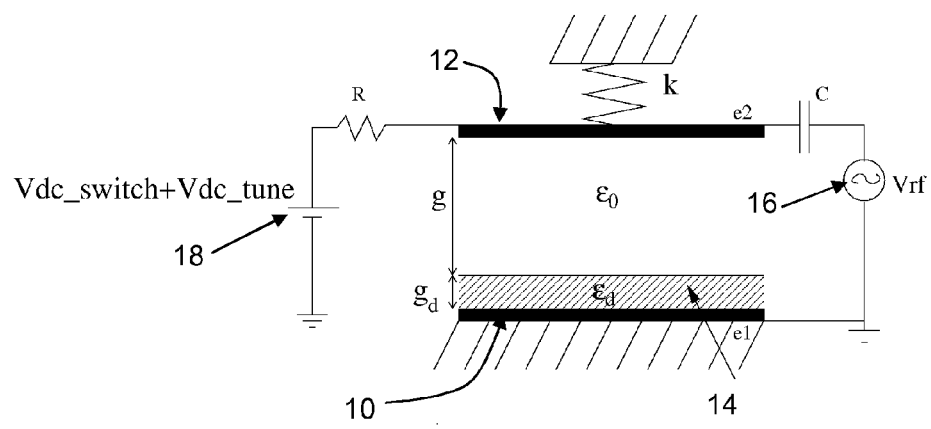
FIG. 1 shows a MEMS device which combines an electrically tunable dielectric and a MEMS switch function.

FIG. 1(b) shows an undulating top electrode 28, FIG. 1(c) shows undulating bottom electrode 22 and dielectric layer 24, FIG. 1(d) shows undulating top electrode, bottom electrode and dielectric layer (with the peaks of one electrode arrangement aligned with the troughs of the other, or with different pitch), so that there is again deformation of the movable electrode when it is brought into contact with the fixed electrode. FIG. 1(e) shows an undulating dielectric layer 24 on top of a planar bottom electrode 22.

An analysis of the invention will now be given, with reference to a non-flat bottom electrode that has an undulation of two maxima and two minima. The invention can however be implemented with any number greater than or equal to 1 maximum and 1 minimum, and all of the possibilities shown in FIGS. 2(b) to 2(e) can be adopted.

When moving down, the suspended membrane (movable electrode 28) first touches the dielectric layer at the point(s) where the distance to the suspended membrane is smallest. Subsequently, the movable electrode deforms under influence of the electrostatic force between the two electrodes. This has three effects:

(i) It further reduces the remaining airgap(s) between the top electrode and the dielectric layer and thus increases the capacitance between the two electrodes.

(ii) It gradually decelerates the suspended membrane in the areas where it is not yet in contact. The spring suspension is designed in such a way that the connections to the membrane do not come in contact first upon landing. The resulting more gradual deceleration results in less spring oscillations and deformations.

(iii) Elastic potential energy is stored in the membrane deformation. This energy is released at the beginning of the opening motion, resulting in a reduced opening time.

The lateral and vertical sizes and shape of the undulations should be tuned for optimal stiffness and energy storage in the deformation of the electrode. The curvature shape determines the amount of stress, which should be below the stress limit everywhere. The undulations also enable an increase in the release voltage, so that the switch can reliably be opened after is has been actuated to the closed position, without needing to bring the actuation voltage as low as in conventional designs. This is the result of the stored elastic energy in the membrane. However, the pull-in cycle is not negatively influenced. The membrane stiffness in the open state is also not altered by the undulations.

Typical dimensions for the thickness of the membrane lie in the order of several microns (e.g. 1 µm to 10 µm, or even 3 µm to 5 µm). When a membrane with such a thickness is deformed by undulations, shear stresses and bending stresses are generated. To avoid excessive stresses in the membrane and the possibility of plastic deformation, shear stresses should be avoided as much as possible. It has been found that this is achieved when the displacements of the membrane are in the order of less than 10% of the thickness. Thus, the height of the peak and depth of the trough is between 0.01t and 0.1t where t is the membrane thickness. This results in undulation heights of less than 500 nm, more preferably less than 400 nm and even more preferably less than 250 nm.

Figure 3:
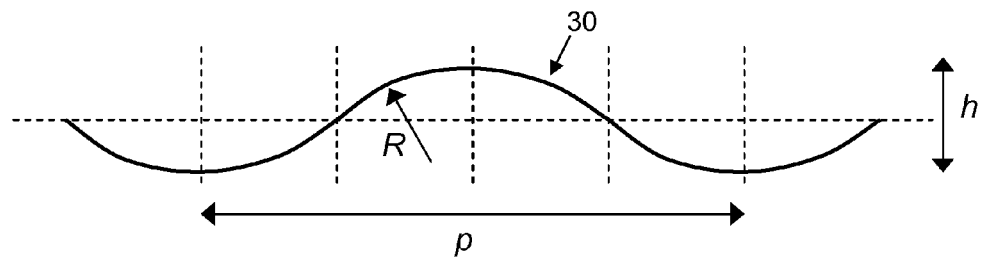
FIG. 3 shows the parameters of interest for modeling the shape of the electrode.

FIG. 3 shows the parameters relevant to the undulations. Line 30 represents the centre line of the membrane. The peak-trough height h is thus less than 0.2 times the thickness of the membrane. The pitch is shown as p (so that 0.5p is the distance between adjacent peaks and troughs) and the radius of curvature of the peak/trough is shown as R.

The bending stress of a rectangular plate, bending in one direction along a bending radius $r_x$ equals:

$$\sigma_x = \frac{Ez}{1-\nu^2}\left(\frac{1}{r_x}\right),$$

with z the height from the neutral plane, E the Young's modulus, and ν the Poisson ratio. For a membrane thickness t, the maximum bending stress then equals:

$$\sigma_x = \frac{Et}{2(1-v^2)}\left(\frac{1}{r_x}\right).$$

For a plate, bending in two directions along bending radii $r_x=r_y=R$, the maximum bending stress equals:

$$\sigma_x = \frac{Et}{2(1-v^2)}\left(\frac{1}{R}+v\frac{1}{R}\right) = \frac{Et}{2R(1-v)}$$

Proper ranges for the undulation pitch can be established by considering the Young's modulus of the material, and the yield stress. Bending stresses should stay well below the yield stress to avoid plastic deformation. The bending radius R is related to the undulation pitch p and undulation height h, by:

$$R = \sqrt{\left(\frac{p}{4}\right)^2 + \left(R - \frac{h}{2}\right)^2},$$

or:

$$R = \frac{p^2 + 4h^2}{16h}$$

For a typical membrane material such as aluminium, E=70 GPa and ν=0.33. If a membrane of 5 μm thick is bent in two directions with undulation height h=500 nm, and the bending stress in x- and y-directions is to be limited to well below the Yield stress (120 Mpa), for example to a value of 50 Mpa, the undulation pitch should not be smaller than:

$$p = \sqrt{\frac{16Eth}{2\sigma_x(1-v)} - 4h^2} \approx 200 \ \mu m.$$

A typical range for the undulation pitch is therefore several hundreds of microns, for example 100-500 μm, depending on the membrane material. More particularly, the most important properties of the material are the Young's modulus and Yield stress. Other suitable materials, besides aluminium, are gold, nickel, and titanium.

The shape of the undulations is preferentially made in such a way that mechanical energy is distributed evenly over the surface. This can be achieved by making the absolute value of the second derivative of the undulations constant in one dimension: i.e. $|d^2z/dx^2|=C$, where C is constant and z is the height of the undulations (and $d^2z/dy^2=0$). This gives a ripple structure, with adjacent sections of parabola with equal second derivatives. It is expected that that height functions z(x,y) which are solutions to the equation $|d^2z/dx^2|+|d^2z/dy^2|=C$ will give an even distribution. Possible solutions are a subset of the harmonic equations, e.g. exp(x)sin(y) or ln(x²+y²) for x²+y₂>r0.

Thus, bending stresses will be distributed uniformly for spherically shaped undulations. Deviations from spherically shaped undulations are also applicable, as the working principle remains unchanged. However, the distribution of the bending stress and maximum bending stress in the membrane will be influenced.

In practice, the undulations are kept as shallow (h small) and densely packed (p small) as possible, subject to the fabrication accuracy, and maintaining the stress below the yield stress. This results in a more uniform stress distribution in the membrane, enhancing the stress release upon opening.

The distance between a peak and adjacent trough (0.5p) is typically in the range 40 to 300 μm, more preferably in the range 50 to 250 μm.

Figure 4:
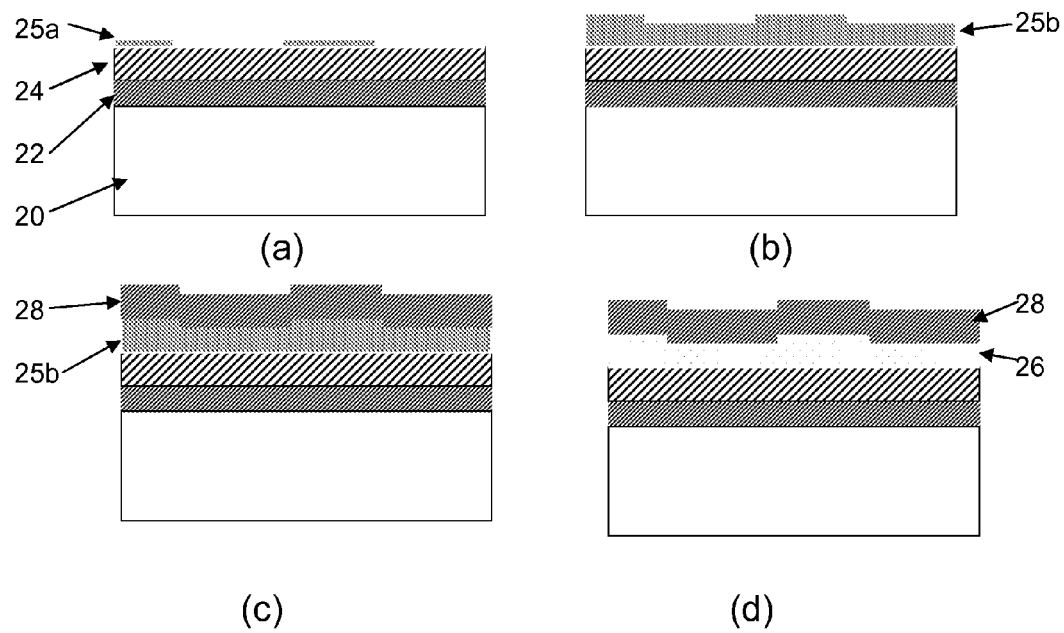
FIG. 4 is used to explain one example of manufacturing method of the invention.

An example of manufacturing method is shown in FIG. 4 for forming a non-flat top electrode. The sacrificial layer (which becomes the air gap after having been removed) is patterened to a varying thickness. The simplest implementation can consist of only two different layer thicknesses, as shown, and costs one mask more than the known MEMS process.

FIG. 4(a) shows the substrate 20, lower electrode 22, dielectric layer 24 and a first patterned portion 25a of the sacrificial layer. The thickness of the first portion determines the height of the undulations, and patterning it determines the lateral dimensions of the undulations.

A second portion of the sacrificial layer is then applied on top of the first one, as shown in FIG. 4(b), to provide the final sacrificial layer profile 25b. The second portion is not patterned and thus has uniform thickness. The height differences will be partly preserved, and transferred to the top electrode 28 as shown in FIG. 4(c).

After removing the sacrificial layer, the top electrode has the desired shape as shown in FIG. 4(d).

This is one preferred method, but there are many alternative methods for forming undulating surfaces. For example:

the top electrode can be made using two different materials with different thermal expansion coefficients to create one or multiple undulations, or the top electrode can be deposited in such a way that stress gradients are introduced which result in undulations, or local height variations can be made lithographically by sputtering or electroplating in or on top of the dielectric layer. The top of the sacrificial layer should then be planarized (e.g. by CMP or spin-on-glass SOG methods).

The local thickness of the top electrode also determines its elastic properties, and can be varied to improve the behaviour.

Figure 5:
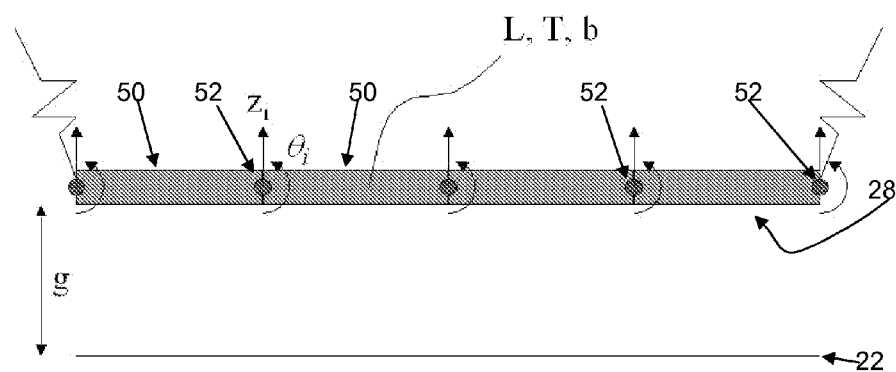
FIG. 5 shows a model of deformable beam used to analyse the benefit of the invention.

To demonstrate the working principle of this invention and to show the amount of the beneficial effect, a simulation example is explained. The simulation example consists of the simple 2D structure shown in FIG. 5.

The structure consists of a membrane with total length L, thickness T, and width (out of the plane of the paper) b, which is suspended over a flat electrode 22 by a suspension system. The membrane is modeled by four Euler beam elements 50 (the four sections in the figure), yielding five nodes 52. Each node i has two degrees of freedom: the vertical displacement z, and the rotation $\theta_i$. The electrode gap is also assumed to include a relatively thin dielectric with uniform thickness $t_d$ (not shown).

The initial gap between the membrane and the top of the electrode 22 is g.

At t=0, a voltage V is applied between the electrode 22 and the membrane 28, generating an electrostatic force. This electrostatic force pulls the membrane down, until it collapses and contacts the flat electrode. The transient behaviour of the membrane is modeled, including damping forces, elastic forces and contact forces. The following values of the geometric dimensions are chosen, and these illustrate the typical values that are appropriate for a MEMS device:

L=200 μm

T=5 μm b=50 μm
g=3 μm
$t_d$=425 nm

Figure 6:
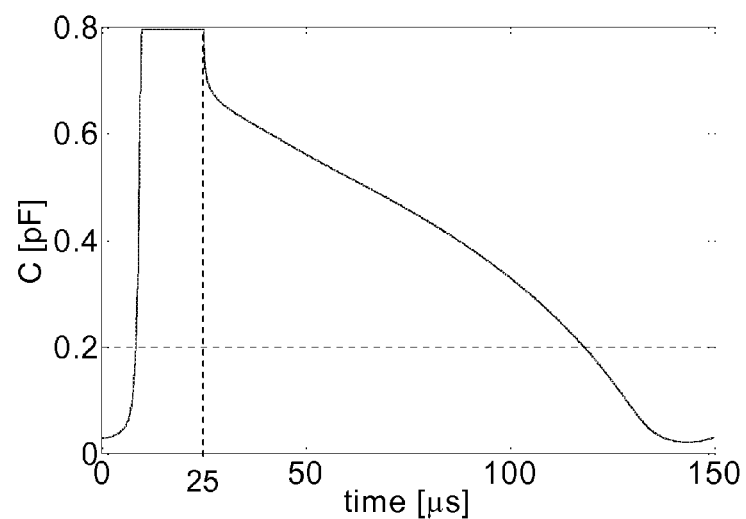
FIG. 6 shows the response of a MEMS device with flat electrodes.

After 25 μs, the actuation voltage V is removed and the switch opens again. For this design with a flat electrode, the transient behaviour can be seen in the capacitance versus time graph of FIG. 6.

The closing and opening time equals 9.8 and 112 μs, respectively.

Figure 7:
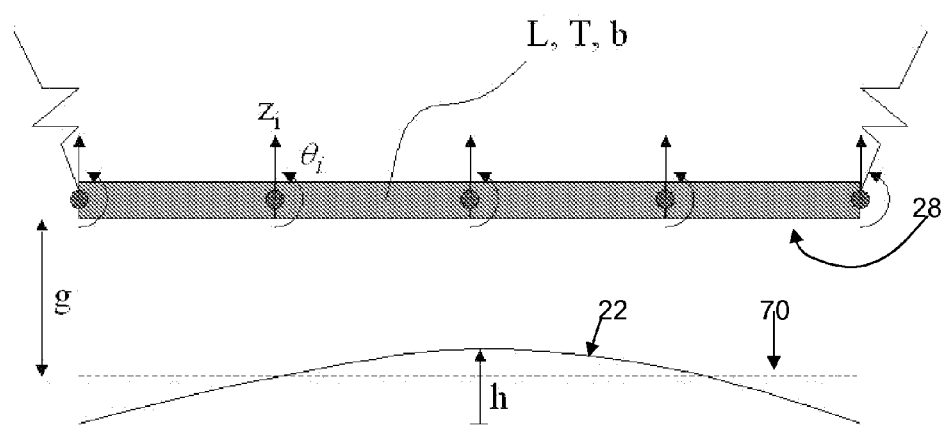
FIG. 7 shows the model of deformable beam in the open state.

Now, a non-flat contact surface is considered. The electrode is assumed to have a sinusoidal shape with amplitude h as shown in FIG. 7. The reference level 70 is chosen such that the capacitance in the open state is not altered compared to the flat electrode case.

Figure 8:
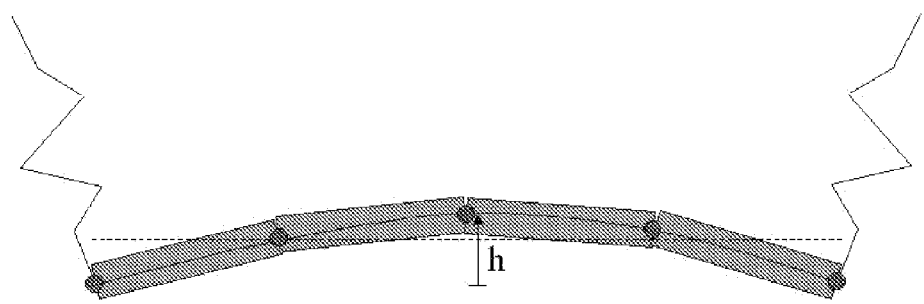
FIG. 8 shows the model of deformable beam in the closed state when deformed by a non-flat contact surface.

The membrane is initially flat. After closure, the membrane is bent as shown in FIG. 8.

Figure 9:
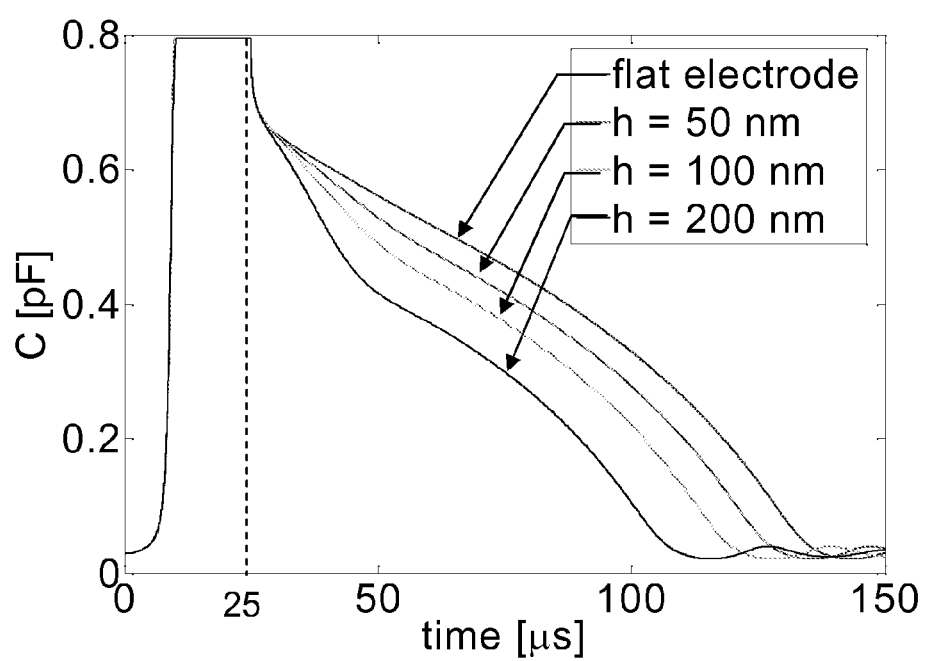
FIG. 9 shows the response of a MEMS device with a non-flat contact surface.

The closing and opening transient is simulated for varying amplitudes h. The capacitance versus time for these situations is shown in FIG. 9. In FIG. 9, the original situation with a flat electrode is also shown.

The switching time is decreased from 112 μs (flat) to:
104 μs (h=50 nm), or −7%
96 μs (h=100 nm), or −14%
84 μs (h=200 nm), or −25%

Part of this decrease is caused by the fact that the springs of the suspension system (connected to the edges of the membrane) are slightly more elongated. However, the main part of the decrease in opening time is caused by the storage of elastic energy in the membrane. In addition, the closing transient and capacitance values in on and off-state are not significantly influenced.

The analysis above is based on a crude model. However, the modeling demonstrates that even a very small curvature in the electrode (order of 0.1 μm over a length of 200 μm) leads to a significant reduction in opening times.

In the figures, the structure of the device is shown only schematically. The detailed implementation will be routine to those skilled in the art of MEMS devices. For example, there should be enough holes in the top electrode to let the air flow in and out, or air channels in the dielectric.

The examples above show capacitive switches, but the invention can also apply to galvanic switches or other MEMS devices in which mechanical contact is made and released.

The dimensions explained above mean that the non-flat beam deforms such that on full closure, there is substantially constant contact between the movable and static electrode arrangement, in the contact region. Thus, the non-flat surface does not mean that the final contact area is reduced, which is a known way to reduce sticking between the electrode arrangements. In examples where one contact surface is flat and the other is undulating, when in the closed position of the switch, the undulating surface is deformed into a substantially flat profile.

As mentioned above, the invention applies to capacitive switched, galvanic switches (with no dielectric) or with tunable capacitive switches using tunable dielectric.

Various modifications will be apparent to those skilled in the art.

The invention claimed is:

1. A MEMS device comprising:
   first and second opposing electrode arrangements, wherein the second electrode arrangement is electrically movable to vary an electrode spacing between facing sides of the first and second electrode arrangements,
   wherein at least one of the facing sides has a non-flat surface with at least two peaks and at least two troughs arranged periodically, the non-flat surface making contact with the other facing side when the electrode spacing is varied to bring the second electrode arrangement into contact with the first electrode arrangement;
   wherein the second electrode arrangement has a thickness t in the range of 1 to 10 μm,
   and wherein a height of a peak and a depth of the trough from a centerline is between 0.01t and 0.1t.

2. A device as claimed in claim 1, wherein a distance between a peak and an adjacent trough is in the range 40 to 300 μm.

3. A device as claimed in claim 2, wherein the distance between the peak and the adjacent trough is in the range 50 to 250 μm.

4. A device as claimed in claim 1, wherein the moveable second electrode arrangement has the non-flat surface and the first electrode arrangement has a flat surface.

5. A device as claimed in claim 1, wherein the moveable second electrode arrangement has a flat surface and the first electrode arrangement has the non-flat surface.

6. A device as claimed in claim 5, wherein the first electrode arrangement comprises a dielectric layer having the non-flat surface.

7. A device as claimed in claim 1, wherein the moveable second electrode arrangement and the first electrode arrangement have non-flat surfaces, with the peak of one aligned with the trough of the other.

8. A device as claimed in claim 1, wherein the non-flat surface has a shape such that a second derivate of the height along a flat axis of the surface is of constant magnitude.

9. A device as claimed in claim 1, further comprising a MEMS capacitive switch, wherein one of the first and second electrode arrangements comprises a dielectric layer and a contact electrode, and the other of the first and second electrode arrangements comprises a contact electrode.

10. A method of manufacturing a MEMS device, comprising:
    forming a static first electrode arrangement; and
    forming a second opposing electrode arrangement with a thickness t in the range 1 to 10 μm, and supported to be electrically movable to vary an electrode spacing between facing sides of the first and second electrode arrangements,
    wherein at least one of the facing sides is formed with a non-flat surface with at least
    two peaks and at least two troughs arranged periodically, with a height of the peak and a depth of the trough from a centerline between 0.01t and 0.1t,
    wherein the non-flat surface is designed to make contact with the other facing side when the electrode spacing is varied to bring the second electrode arrangement into contact with first electrode arrangement.

11. A method as claimed in claim 10, further comprising:
    forming the first electrode arrangement on a substrate;
    forming a sacrificial layer over the first electrode arrangement, a top surface of the sacrificial layer having a non-flat profile;
    forming the second electrode arrangement over the sacrificial layer; and
    removing the sacrificial layer, thereby exposing an underside of the second electrode arrangement with the non-flat surface.

12. A method as claimed in claim 11, wherein the forming the first electrode arrangement comprises forming a contact electrode and a dielectric layer over the contact electrode.

13. A method as claimed in claim 10, wherein forming the sacrificial layer comprises forming a first non-flat first sacrificial layer portion and forming a second uniform thickness second sacrificial layer portion.

14. A method as claimed in claim 10, wherein a distance between a peak and adjacent trough is formed in the range 40 to 300 µm.

* * * * *